US006835648B2

(12) United States Patent
Hong et al.

(10) Patent No.: US 6,835,648 B2
(45) Date of Patent: Dec. 28, 2004

(54) SEMICONDUCTOR PMD LAYER DIELECTRIC

(75) Inventors: Qi-Zhong Hong, Richardson, TX (US); Peter Huang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/448,097

(22) Filed: May 29, 2003

(65) Prior Publication Data

US 2004/0238853 A1 Dec. 2, 2004

(51) Int. Cl.[7] ...................... H01L 21/4763; H01L 23/48
(52) U.S. Cl. ...................... 438/622; 438/626; 438/637; 257/758; 257/760
(58) Field of Search ...................... 438/622, 624, 438/631, 637, 692, 626; 257/758, 759, 760, 774

(56) References Cited

U.S. PATENT DOCUMENTS 6,165,916 A * 12/2000 Muraoka et al. ............ 438/791
6,706,635 B2 * 3/2004 Khan et al. .................. 438/692

* cited by examiner

*Primary Examiner*—Kevin M. Picardat
(74) *Attorney, Agent, or Firm*—Rose Alyssa Keagy; W. James Brady, III; Frederick J. Telecky, Jr.

(57) ABSTRACT

An embodiment of the invention is a method of manufacturing a semiconductor wafer 2 where a layer of undoped silicon glass 15 is formed over the front-end structure 3. Another embodiment of the present invention is an integrated circuit 2 having a back-end structure 4 in which the dielectric layer 15 contains undoped silicon glass.

26 Claims, 3 Drawing Sheets

SEMICONDUCTOR PMD LAYER DIELECTRIC

BACKGROUND OF THE INVENTION

This invention relates to the improvement of the dielectric used in the poly-metal dielectric layer of a semiconductor device.

DETAILED DESCRIPTION OF THE INVENTION

Figure 1:
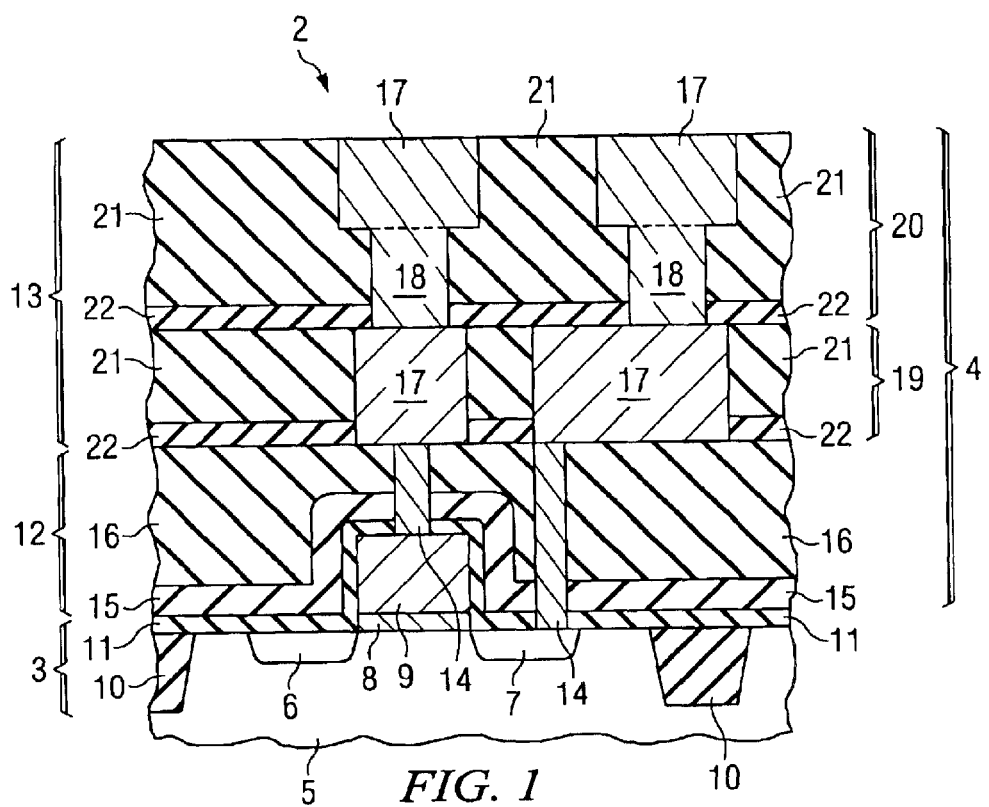
FIG. 1 is a cross-section view of a semiconductor wafer in accordance with a first embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 depicts a best mode application of the present invention. More specifically, FIG. 1 shows a cross section of a portion 2 of a semiconductor wafer. The example semiconductor wafer portion 2 is divided into two sections: a front-end 3 and a back-end 4. It is within the scope of the invention to have any form of logic within the front-end 3. The example logic contained in the front-end 3 shown in FIG. 1 is a transistor formed in a semiconductor substrate 5. The transistor has a source/drain 6, 7 and a gate dielectric/electrode 8, 9. Any one of a number of isolation structures 10 is used adjacent to the transistor to electrically separate the transistors from each other. Immediately above the transistor is a layer of insulation 11 such as SiN.

The back-end module 4 contains a poly-metal dielectric ("PMD") layer 12 and one or more inter-level dielectric ("ILD") layers. The inter-level dielectric layers 13 contain metal lines 17 that route electrical signals and power properly through the electronic device. In addition, the inter-level dielectric layers 13 contain vias 18 that properly connect the metal lines 17 of a first inter-level dielectric layer 19 to the metal lines 17 of a second inter-level dielectric layer 20. As an example, the metal interconnects 17 and vias 18 may be comprised of any metal such as copper. The metal interconnects 17 and vias 18 are electrically insulated by any one of a number of dielectric materials 21. In the example application, the dielectric insulation 21 is a low-k material such as Organo-Silicate Glass ("OSG").

In addition, there is a thin dielectric barrier layer 22 formed between the dielectric layers 21 of inter-level dielectric layers 19, 20. It is within the scope of this invention to use any suitable material for the barrier layer 22. For example, the barrier layer 22 may comprise SiC. The use of a barrier layer 22 is optional; however, the barrier layer 22 may perform many functions. For example, barrier layer 22 may function as a barrier; preventing the diffusion of copper from interconnects 17 to either the silicon channel of the transistor or another insulated metal interconnect 17 (thereby creating an electrical short). Second, barrier layer 22 may function as an etch stop when forming the metal features 17, 18 within the dielectric insulation 21 during back-end manufacturing. Lastly, the dielectric layer 22 may function as an adhesion layer to help hold a layer of OSG 21 to metal interconnects 17 or vias 18.

The PMD layer 12 contains metal contacts 14 which electrically tie the example transistor to the other logic elements (not shown) of the front-end structure 3. As an example, the metal contacts 14 may comprise tungsten having a tungsten liner.

In accordance with the best mode application, the dielectric used in the PMD layer 12 is a dielectric stack consisting of a layer of undoped silicon glass 15 and an overlying layer of p-doped silicon glass 16. The thickness of the layer of undoped silicon glass 15 can range from 500 Å–5,000 Å. However a thickness between 1,000 Å–3,000 Å is preferred. The thickness of the layer of p-doped silicon glass 16 can range from 1,000 Å–10,000 Å. However a thickness between 1,500 Å–6,500 Å is preferred.

Figure 2:
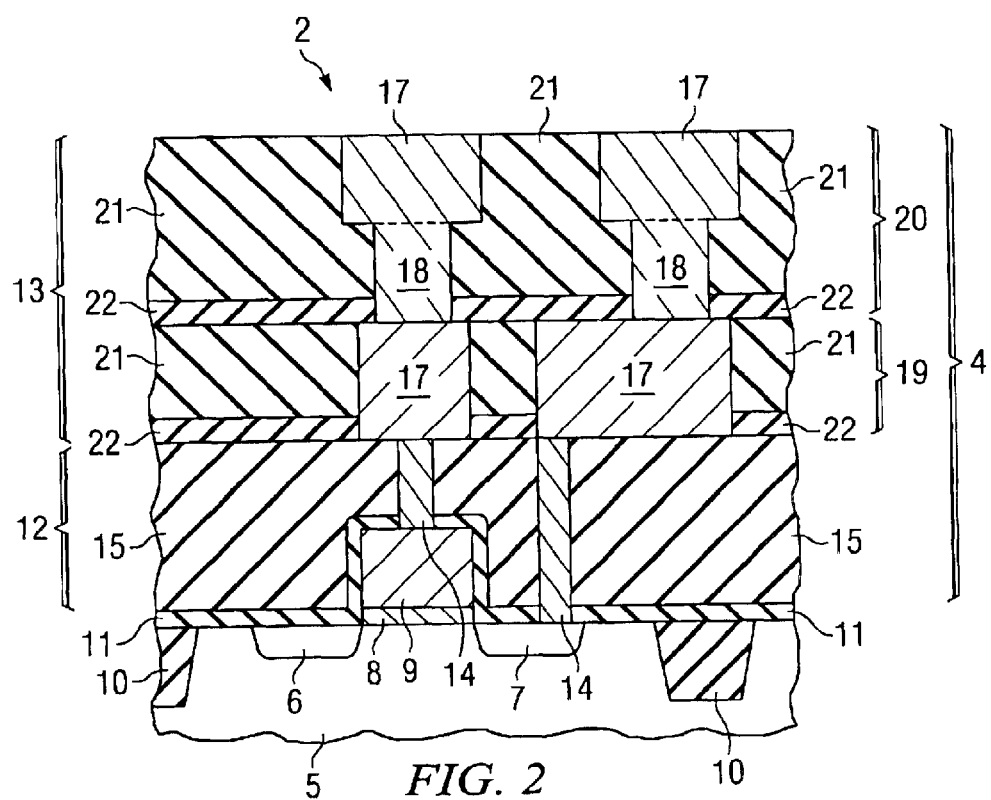
FIG. 2 is a cross-section view of a semiconductor wafer in accordance with a second embodiment of the present invention.
Figure 3:
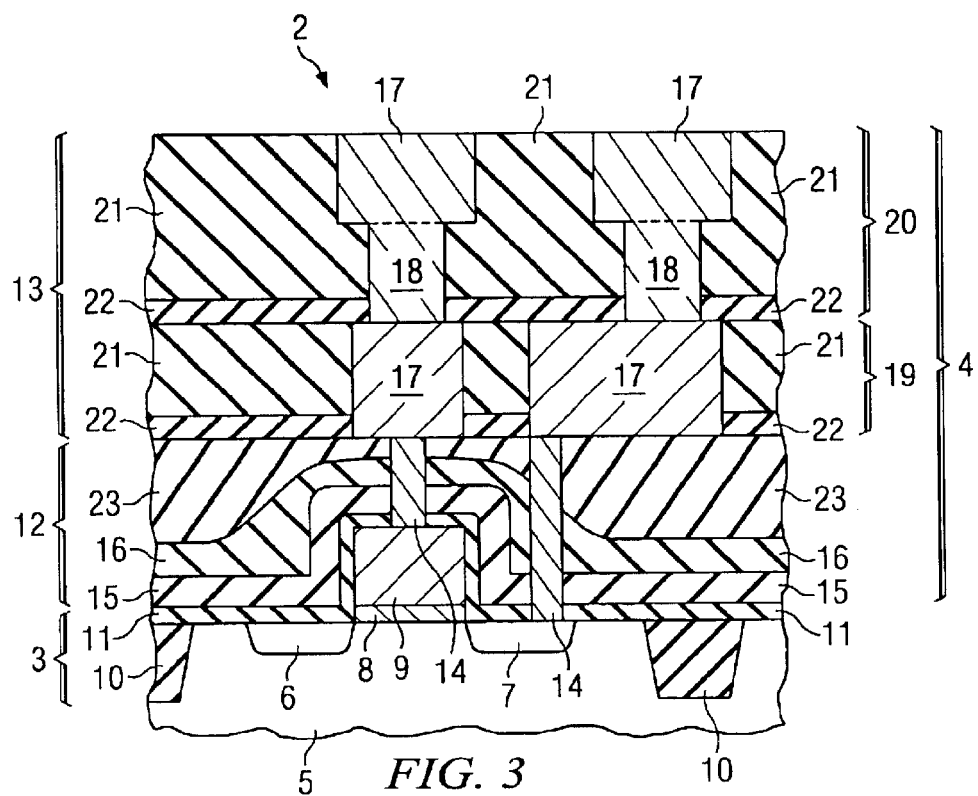
FIG. 3 is a cross-section view of a semiconductor wafer in accordance with a third embodiment of the present invention.

The use of other dielectric structures within the PMD layer 12 is also within the scope of this invention. For example, the dielectric may be a single layer of undoped silicon glass 15, as shown in FIG. 2. Furthermore, the dielectric may be a material stack consisting of a first layer of undoped silicon glass 15, a second layer of p-doped silicon glass 16, and a third layer of undoped silicon glass 23, as shown in FIG. 3. In this example application, the top layer of undoped silicon glass 23 has a thickness between 500 Å–3,000 Å. However a thickness between 500 Å–1,500 Å is preferred.

Figure 4:
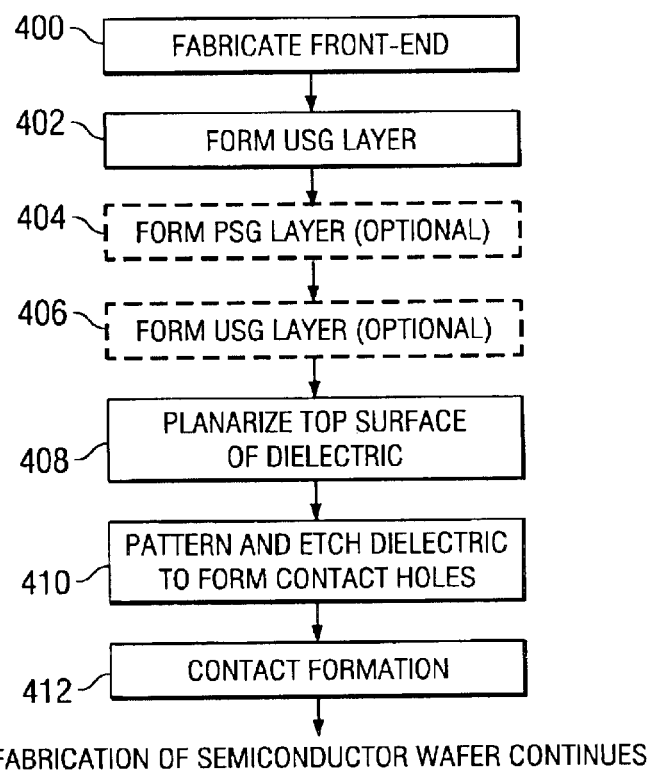
FIG. 4 is a flow diagram illustrating the process flow of the present invention.

Referring again to the drawings, FIG. 4 is a flow diagram illustrating the process flow of the present invention. Other than process step 402 and possibly process steps 404 and 406, the front-end and back-end process steps should be that standard in the industry.

The present invention may be used in any integrated circuit configuration; therefore the front-end 3 may be fabricated (step 400) to perform any device function. Generally, the last step in the fabrication of the front-end 3 is the formation of a layer of dielectric 11. The dielectric layer 11 may be SiN deposited by plasma-enhanced chemical vapor deposition ("PECVD").

Now the PMD layer 12 is fabricated over the front-end 3. The first step is to form the PMD dielectric in accordance with the present invention. In the best mode application, the PMD dielectric is a layer of undoped silicon glass ("USG")

and a layer of p-doped silicon glass ("PSG") that are deposited in-situ (i.e. without breaking vacuum). More specifically, a first chamber of the Centura/Producer manufactured by Applied Materials ("AMT") may be used to form the USG layer 15 and then the semiconductor wafer is moved to a second chamber in the same machine where the PSG layer 16 is formed.

In this example best mode process the USG layer 15 and PSG layer 16 are formed using a sub-atmospheric pressure chemical vapor deposition ("SACVD") process. The USG layer 15 is deposited (step 402) using Tetraethyloxysilane ("TEOS" or "Si(OC$_2$H$_5$)$_4$") and O$_3$ precursors at a temperature between 350–550° C. and a pressure between 200–700 Torr. The PSG layer 16 is deposited (step 404) using Triethylphosphate ("TEPO" or "PO(OC$_2$H$_5$)$_3$") as the dopant together with TEOS and O$_3$ precursors at a temperature between 350–550° C. and a pressure between 200–700 Torr.

Optionally, a third dielectric layer (shown in FIG. 3) may now be formed in step 406. If formed, another USG layer 23 is deposited in-situ (step 406) using TEOS and 03 precursors at a temperature between 350–550° C. and a pressure between 200–700 Torr.

In accordance with the invention, all PMD dielectric layers are formed in-situ. It is possible to anneal the semiconductor wafer once the dielectric layers are formed. If performed, the anneal may provide stress relaxation and improve the microstructure of the dielectric layers. Example anneal conditions are 450–700° C. for 2–40 minutes in an inert gas.

Figure 5A:
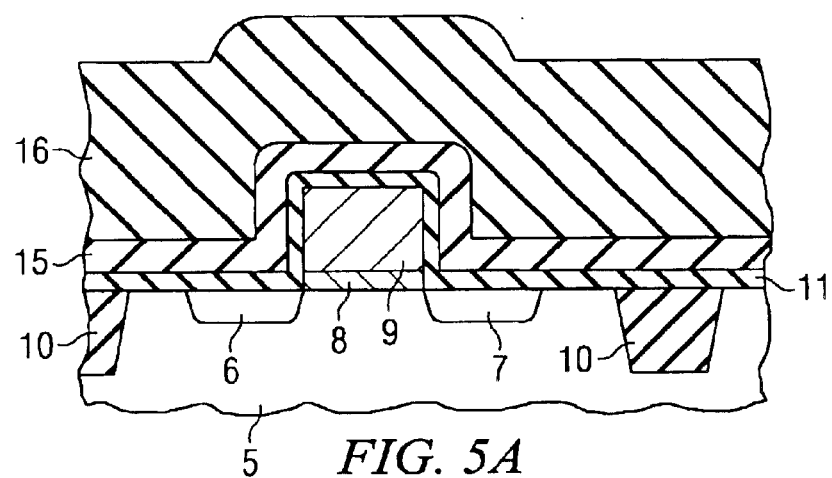
FIGS. 5A and 5B are cross-sectional views of a partially fabricated semiconductor wafer in accordance with the present invention.
Figure 5B:
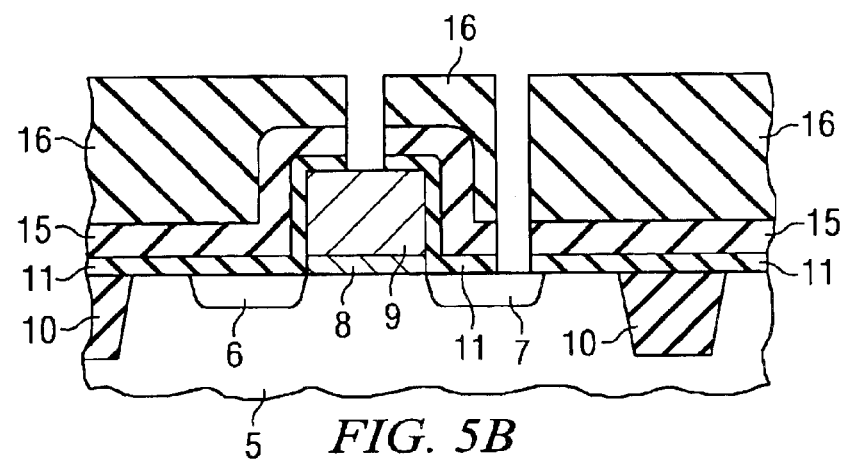

At this point in the manufacturing process, there are one or more dielectric layers formed over the semiconductor wafer. Referring again to the drawings, FIG. 5A shows an example portion of a semiconductor wafer having an USG layer 15 and a PSG layer 16 at this point in the manufacturing process. The next step is planarizing (step 408) the top layer of the dielectric stack. The PSG layer 16 may be planarized using any conventional process such as chemical mechanical polish ("CMP"). In step 410, the dielectric layers 15, 16 and the isolation layers 11 are etched using any well known process to form locations for the contacts 14. FIG. 5B shows an example portion of a semiconductor wafer after the planarization and patterning steps. Next (step 412) the contact layer is formed; first depositing a layer of Ti, TiN, tungsten and then performing a CMP to expose the top layer of dielectric 16 thereby forming the contacts 14.

Various modifications to the invention as described above are within the scope of the claimed invention. As an example, instead of a one, two, or three layer PMD dielectric as described above, the PMD dielectric may comprise any number of layers stacked in any sequence. Instead of OSG, the dielectric material 21 may be aerogel, BLACK DIAMOND, xerogel, SiLK, or HSQ. Similarly, instead of SiC, the barrier material 22 may be silicon nitride, silicon oxide, nitrogen-doped silicon carbide, or oxygen doped silicon carbide. The contacts 14 may be comprised of a different suitable material such as molybdenum, titanium, titanium nitride, tantalum nitride, or metal suicides such as Ti, Ni, Co copper or doped polysilicon. Similarly, the metal interconnects 17 and vias 18 may be comprised of any suitable metal, such as Cu, W, or Al. In addition, it is within the scope of the invention to have a back-end structure 4 with a different amount or configuration of metal layers 13 than is shown in FIGS. 1–3.

Furthermore, the invention is applicable to semiconductor wafers having different front-end well and substrate technologies, transistor configurations, and metal connector materials or configurations. Moreover, the invention is applicable to other semiconductor technologies such as BiCMOS, bipolar, SOI, strained silicon, pyroelectric sensors, optoelectronic devices, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of manufacturing a semiconductor wafer comprising:

forming a front-end structure over a semiconductor substrate, said front-end structure having a top dielectric layer; and forming a layer of undoped silicon glass over said top dielectric layer of said front-end structure.

2. The method of claim 1 further comprising:

planarizing said layer of undoped silicon glass; and forming contacts within said planarized layer of undoped silicon glass.

3. The method of claim 1 wherein said layer of undoped silicon glass has a thickness between 500 Å and 5,000 Å.

4. A method of manufacturing a semiconductor wafer comprising:

forming a front-end structure over a semiconductor substrate, said front-end structure having a top dielectric layer;

forming a layer of undoped silicon glass over said top dielectric layer of said front-end structure; and forming a layer of p-doped silicon glass over said layer of undoped silicon glass.

5. The method of claim 4 further comprising:

planarizing said layer of p-doped silicon glass; and forming contacts within said planarized layer of p-doped silicon glass and said layer of undoped silicon glass.

6. The method of claim 4 wherein said layer of p-doped silicon glass has a thickness between 1,000 Å and 10,000 Å.

7. The method of claim 4 wherein said layer of undoped silicon glass has a thickness between 500 Å and 5,000 Å.

8. The method of claim 4 wherein said steps of forming said layer of undoped silicon glass and forming said layer of p-doped silicon glass are performed in-situ.

9. A method of manufacturing a semiconductor wafer comprising:

forming a front-end structure over a semiconductor substrate, said front-end structure having a top dielectric layer;

forming a first layer of undoped silicon glass over said top dielectric layer of said front-end structure;

forming a layer of p-doped silicon glass over said first layer of undoped silicon glass; and forming a second layer of undoped silicon glass over said layer of p-doped silicon glass.

10. The method of claim 9 further comprising:

planarizing said second layer of undoped silicon glass; and forming contacts within said planarized second layer of undoped silicon glass, said layer of p-doped silicon glass, and said first layer of undoped silicon glass.

11. The method of claim 9 wherein said layer of p-doped silicon glass has a thickness between 1,000 Å and 10,000 Å.

12. The method of claim 9 wherein said first layer of undoped silicon glass has a thickness between 500 Å and 5,000 Å.

13. The method of claim 9 wherein said second layer of undoped silicon glass has a thickness between 500 Å and 3,000.

14. The method of claim 9 wherein said steps of forming said layer of undoped silicon glass, forming said layer of p-doped silicon glass, and forming said second layer of undoped silicon glass are performed in-situ.

15. The method of claim 9 further comprising:

forming in-situ at least one more layer of undoped silicon glass over said semiconductor wafer.

16. The method of claim 9 further comprising:

forming in-situ at least one more layer of p-doped silicon glass over said semiconductor wafer.

17. An integrated circuit comprising:

a semiconductor substrate;

a front-end structure coupled to said semiconductor substrate, said front-end structure having a top dielectric layer; and a first layer of a back-end structure coupled to said front-end structure, said first layer of a back end structure having first layer interconnects and a first layer dielectric; said first layer dielectric containing undoped silicon glass directly coupled to said top dielectric layer of said front-end structure.

18. The method of claim 17 wherein said layer of undoped silicon glass has a thickness between 500 Å and 5,000 Å.

19. An integrated circuit comprising:

a semiconductor substrate;

a front-end structure coupled to said semiconductor substrate, said front-end structure having a top dielectric layer; and a first layer of a back-end structure coupled to said front-end structure, said first layer of a back end structure having first layer interconnects and a first layer dielectric; said first layer dielectric containing a layer of undoped silicon glass directly coupled to said top dielectric layer of said front-end structure and a layer of p-doped silicon glass over said layer of undoped silicon glass.

20. The method of claim 19 wherein said layer of p-doped silicon glass has a thickness between 1,000 Å and 10,000 Å.

21. The method of claim 19 wherein said layer of undoped silicon glass has a thickness between 500 Å and 5,000 Å.

22. An integrated circuit comprising:

a semiconductor substrate;

a front-end structure coupled to said semiconductor substrate, said front-end structure having a top dielectric layer; and a first layer of a back-end structure coupled to said front-end structure, said first layer of a back end structure having first layer interconnects and a first layer dielectric; said first layer dielectric containing a first layer of undoped silicon glass directly coupled to said top dielectric layer of said front-end structure, a layer of p-doped silicon glass over said first layer of undoped silicon glass, and a second layer of undoped silicon glass over said layer of p-doped silicon glass.

23. The method of claim 22 wherein said layer of p-doped silicon glass has a thickness between 1,000 Å and 10,000 Å.

24. The method of claim 22 wherein said first layer of undoped silicon glass has a thickness between 500 Å and 5,000 Å.

25. The method of claim 22 wherein said second layer of undoped silicon glass has a thickness between 500 Å and 3,000 Å.

26. An integrated circuit comprising:

a semiconductor substrate;

a front-end structure coupled to said semiconductor substrate, said front-end structure having a top dielectric layer; and a first layer of a back-end structure coupled to said front-end structure, said first layer of a back end structure having first layer interconnects and a first layer dielectric; said first layer dielectric containing a layer of undoped silicon glass directly coupled to said top dielectric layer of said front-end structure, at least one additional layer of undoped silicon glass, and at least one layer of p-doped silicon glass.

* * * * *